(12) United States Patent
Kang et al.

(10) Patent No.: US 7,583,869 B2
(45) Date of Patent: Sep. 1, 2009

(54) ELECTROABSORPTION DUPLEXER

(75) Inventors: Young Shik Kang, Daejeon (KR); Je Ha Kim, Daejeon (KR); Sung Bock Kim, Daejeon (KR); Yong Duck Chung, Daejeon (KR); Kwang Seong Choi, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/451,743

(22) Filed: Jun. 13, 2006

(65) Prior Publication Data

US 2007/0171515 A1   Jul. 26, 2007

(30) Foreign Application Priority Data

Dec. 7, 2005   (KR) ...................... 10-2005-0118639
Feb. 15, 2006  (KR) ...................... 10-2006-0014685

(51) Int. Cl.
    G02B 6/12   (2006.01)
(52) U.S. Cl. ......................................... 385/14; 385/129
(58) Field of Classification Search ........... 398/35–139, 398/140–172; 359/584, 587; 385/43,47, 385/2, 5, 123
See application file for complete search history.

(56) References Cited

U.S. PATENT DOCUMENTS 4,693,544 A * 9/1987 Yamasaki et al. ............. 385/47

(Continued)

FOREIGN PATENT DOCUMENTS

DE           10044521 A1 * 4/2002
JP           06-130438      5/1994
KR           10-2004-0052272   6/2004
KR           1020050023124   3/2005

OTHER PUBLICATIONS

Young-Shik Kang, Shung-Bock Kim, Yong-Duck Chung, and Jeha Kim; "Optical Coupling Analysis of Dual-Waveguide Structure for Monolithic Integration of Photonic Devices;" Nov. 2005; IEEE Photonics Technology Letters; vol. 17, No. 11; pp. 2304-2306.*

(Continued)

Primary Examiner—Frank G Font
Assistant Examiner—Peter Radkowski
(74) Attorney, Agent, or Firm—Ladas & Parry LLP

(57) ABSTRACT

An electroabsorption (EA) duplexer in which an optical amplifier, a photodetector, and an optical modulator are monolithically integrated to obtain a high radio frequency (RF) gain in radio-over fiber (RoF) link optical transmission technology is provided. The EA duplexer includes a substrate, a separation area, an optical detection/modulation unit, and an optical amplification unit. The separation area includes a first epitaxial layer formed of at least one material layer on the substrate. The first epitaxial layer functions as a first optical waveguide. The optical detection/modulation unit includes a second epitaxial layer formed of at least one material layer on the first epitaxial layer to detect and modulate an optical signal. The second epitaxial layer functions as a second optical waveguide. The optical amplification unit includes the second optical waveguide and a third epitaxial layer formed of at least one material layer on the second epitaxial layer to amplify an optical signal. The third epitaxial layer functions as a third optical waveguide. The optical amplification unit is electrically separated from the optical detection/modulation unit by the separation area and is disposed on at least one side of the optical detection/modulation unit.

21 Claims, 7 Drawing Sheets

U.S. PATENT DOCUMENTS

| | | | | |
|---|---|---|---|---|
| 4,932,032 | A * | 6/1990 | Koch et al. | 372/45.01 |
| 5,031,188 | A * | 7/1991 | Koch et al. | 372/50.11 |
| 5,078,516 | A * | 1/1992 | Kapon et al. | 385/129 |
| 5,090,790 | A * | 2/1992 | Zucker | 385/130 |
| 5,127,081 | A * | 6/1992 | Koren et al. | 385/130 |
| 5,140,149 | A * | 8/1992 | Sakata et al. | 257/436 |
| 5,323,476 | A * | 6/1994 | Mueller et al. | 385/43 |
| 5,502,783 | A * | 3/1996 | Wu | 385/42 |
| 5,559,912 | A * | 9/1996 | Agahi et al. | 385/42 |
| 5,657,338 | A * | 8/1997 | Kitamura | 372/50.1 |
| 5,720,893 | A * | 2/1998 | Ben-Michael et al. | 216/24 |
| 5,754,714 | A * | 5/1998 | Suzuki et al. | 385/5 |
| 5,763,287 | A * | 6/1998 | Itagaki et al. | 438/31 |
| 5,787,106 | A * | 7/1998 | Tabuchi et al. | 372/50.1 |
| 5,793,913 | A * | 8/1998 | Kovacic | 385/49 |
| 5,910,012 | A * | 6/1999 | Takeuchi | 438/31 |
| 5,917,980 | A * | 6/1999 | Yoshimura et al. | 385/129 |
| 5,985,685 | A * | 11/1999 | Lealman et al. | 438/31 |
| 5,987,046 | A * | 11/1999 | Kobayashi et al. | 372/45.01 |
| 6,030,540 | A * | 2/2000 | Yamamoto et al. | 216/47 |
| 6,034,983 | A * | 3/2000 | Fujii et al. | 372/43.01 |
| 6,075,801 | A * | 6/2000 | Tamanuki et al. | 372/46.01 |
| 6,141,477 | A * | 10/2000 | Kitamura | 385/131 |
| 6,162,655 | A * | 12/2000 | Johnson et al. | 438/31 |
| 6,229,947 | B1 | 5/2001 | Vawter et al. | 385/132 |
| 6,238,943 | B1 * | 5/2001 | Kobayashi et al. | 438/31 |
| 6,240,233 | B1 * | 5/2001 | Weinert et al. | 385/131 |
| 6,282,345 | B1 * | 8/2001 | Schimpe | 385/50 |
| 6,293,688 | B1 * | 9/2001 | Deacon | 362/556 |
| 6,310,995 | B1 * | 10/2001 | Saini et al. | 385/28 |
| 6,341,189 | B1 * | 1/2002 | Deacon | 385/130 |
| 6,345,138 | B1 * | 2/2002 | Kawai et al. | 385/49 |
| 6,465,269 | B2 * | 10/2002 | Furushima | 438/31 |
| 6,498,873 | B1 * | 12/2002 | Chandrasekhar et al. | 385/28 |
| 6,510,266 | B2 * | 1/2003 | Lauzon et al. | 385/40 |
| 6,556,759 | B2 * | 4/2003 | Roberts et al. | 385/132 |
| 6,558,048 | B2 * | 5/2003 | Kuhara et al. | 385/93 |
| 6,718,108 | B2 * | 4/2004 | Kusakabe | 385/131 |
| 6,724,966 | B2 * | 4/2004 | Mukasa | 385/127 |
| 6,768,855 | B1 * | 7/2004 | Bakke et al. | 385/129 |
| 6,778,309 | B2 * | 8/2004 | Freund et al. | 359/259 |
| 6,795,622 | B2 * | 9/2004 | Forrest et al. | 385/50 |
| 6,804,421 | B2 * | 10/2004 | Bond et al. | 385/2 |
| 6,813,417 | B2 * | 11/2004 | Oh et al. | 385/43 |
| 6,888,973 | B2 * | 5/2005 | Kolodziejski et al. | 385/14 |
| 6,936,839 | B2 | 8/2005 | Taylor | |
| 6,956,983 | B2 * | 10/2005 | Morse | 385/14 |
| 6,985,648 | B2 * | 1/2006 | Kish et al. | 385/14 |
| 6,987,912 | B2 * | 1/2006 | Morse | 385/43 |
| 6,987,919 | B2 * | 1/2006 | Luo et al. | 385/129 |
| 7,005,247 | B1 * | 2/2006 | Fong et al. | 430/321 |
| 7,058,246 | B2 * | 6/2006 | Joyner et al. | 385/14 |
| 7,062,114 | B2 * | 6/2006 | Webjorn et al. | 385/14 |
| 7,068,870 | B2 * | 6/2006 | Steinberg et al. | 385/14 |
| 7,079,715 | B2 * | 7/2006 | Kish et al. | 385/14 |
| 7,079,718 | B2 * | 7/2006 | Welch et al. | 385/14 |
| 7,079,719 | B2 * | 7/2006 | Kish et al. | 385/14 |
| 7,079,720 | B2 * | 7/2006 | Kish et al. | 385/14 |
| 7,079,721 | B2 * | 7/2006 | Kish et al. | 385/14 |
| 7,088,501 | B2 * | 8/2006 | Shibata et al. | 359/344 |
| 7,092,589 | B2 * | 8/2006 | Kish et al. | 385/14 |
| 7,095,938 | B2 * | 8/2006 | Tolstikhin | 385/131 |
| 7,103,239 | B2 * | 9/2006 | Kish et al. | 385/14 |
| 7,116,851 | B2 * | 10/2006 | Welch et al. | 385/14 |
| 7,158,701 | B2 * | 1/2007 | Dautartas | 385/37 |
| 7,200,296 | B2 * | 4/2007 | Kish et al. | 385/14 |
| 7,205,662 | B2 * | 4/2007 | Narasimhan et al. | 257/751 |
| 7,221,825 | B2 * | 5/2007 | Reed et al. | 385/37 |
| 7,251,406 | B2 * | 7/2007 | Luo et al. | 385/131 |
| 7,283,694 | B2 * | 10/2007 | Welch et al. | 385/14 |
| 7,303,339 | B2 * | 12/2007 | Zhou et al. | 385/91 |
| 7,317,853 | B2 * | 1/2008 | Laurent-Lund et al. | 385/43 |
| 7,359,588 | B2 * | 4/2008 | Kang et al. | 385/14 |
| 2002/0028045 | A1 * | 3/2002 | Yoshimura et al. | 385/50 |
| 2002/0141682 | A1 * | 10/2002 | Ryu et al. | 385/14 |
| 2003/0026515 | A1 * | 2/2003 | Barenburg et al. | 385/14 |
| 2003/0035632 | A1 * | 2/2003 | Glebov et al. | 385/43 |
| 2003/0063877 | A1 * | 4/2003 | Mukasa | 385/123 |
| 2003/0081878 | A1 * | 5/2003 | Joyner et al. | 385/14 |
| 2003/0095736 | A1 * | 5/2003 | Kish et al. | 385/14 |
| 2003/0095737 | A1 * | 5/2003 | Welch et al. | 385/14 |
| 2003/0128922 | A1 * | 7/2003 | Kolodziejski et al. | 385/27 |
| 2004/0032646 | A1 | 2/2004 | Koren et al. | |
| 2004/0067006 | A1 * | 4/2004 | Welch et al. | 385/14 |
| 2004/0096175 | A1 * | 5/2004 | Tolstikhin | 385/131 |
| 2004/0105475 | A1 * | 6/2004 | Wasserbauer | 372/50 |
| 2004/0120648 | A1 * | 6/2004 | Kwon et al. | 385/43 |
| 2006/0126987 | A1 * | 6/2006 | Kang et al. | 385/2 |
| 2006/0228067 | A1 * | 10/2006 | Joyner et al. | 385/14 |

OTHER PUBLICATIONS

K. Asaka, Y. Suzaki, Y. Kawaguchi, S. Kondo, Y. Noguchi, H. Okamoto; "Lossless Electroabsorption Modulator Monolithically Integrated with a Semiconductor Optical Amplifier and a Passive Waveguide;" May 2003; IEEE Photonics Technology Letters; vol. 15, No. 5; pp. 679-681.*

In Kim, Byung-Kwon Kang, Yu-Dong Bae, Byeonghoon Park, Sang-Moon Lee, Young Hyun Kim, and Dong-Hoon Jang; "Design of Amplifier- and Modulator-Integrated Laser Diode for 10-Gb/s 80-km Transmission;" Mar./Apr. 2005; IEEE Journal of Selected Topics in Quantum Electronics; vol. 11, No. 2, pp. 323-328.*

Lee et al. "Asymmetric Waveguides Vertical Coulers for Polarization-Independent Coupling and Polarization-Mode Splitting," 2005, J. Of Light Wave Technology, V. 23, N. 4, p. 1818.*

Hou et al. "Lossless Electroabsorption Modulator Monolithically Integrated with a Semiconductor Optical Amplifier and Dual-Waveguide Spot-Size Converters," 2005. IEEE Photonics Technology Letters, V. 17, N. 8, p. 1635.*

Miyazaki et al. "Eye-Opening Improved Electroabsorption Modulator/DFB Laser Diode with Optimized Thickness of the Separate-ConfinementHetrostructure Layers," 2000, IEEEE Journal of Quantum Electronics, V. 36, N. 8, p. 909.* n Kim, Byung-Kwon Kang, Yu-Dong Bae, Byeonghoon Park, Sang-Moon Lee, Young Hyun Kim, and Dong-Hoon Jang; "Design of Amplifier- and Modulator-Integrated Laser Diode for 10-Gb/s 80-km Transmission;" Mar./Apr. 2005; IEEE Journal of Selected Topics in Quantum Electronics; vol. 11, No. 2, pp. 323-328.*

'Monolithically Integrated Semiconductor Optical Amplifier and Electroabsorption Modulator with Dual-Waveguide Spot-Size Converter Input' Johnson et al., IEEE Journal of Selected Topics in Quantum Electronics, vol. 6, No. 1, Jan./Feb. 2000, pp. 19-25.

'Reliability of 1300-nm Spot-Size Converter Integrated Laser Diodes for Low-Cost Optical Modules in Access Networks' Oohashi et al., Journal of Lightwave Technology, vol. 16, No. 7, Jul. 1998, pp. 1302-1307.

* cited by examiner

ELECTROABSORPTION DUPLEXER

CROSS-REFERENCE TO RELATED PATENT APPLICATIONS

This application claims the benefit of Korean Patent Application Nos. 10-2005-0118639, filed on Dec. 7, 2005 and 10-2006-0014685, filed on Feb. 15, 2006, in the Korean Intellectual Property Office, the disclosure of which are incorporated herein in their entirety by reference.

BACKGROUND OF THE INVENTION

1. Field of the Invention

The present invention relates to a radio-over fiber (RoF) system, and more particularly, to an electroabsorption duplexer including an optical amplifier, a photodetector, and an optical modulator which are monolithically integrated to be suitable to analog optical communication.

2. Description of the Related Art

In analog optical transmission, optical power is modulated in accordance with an electrical signal having a predetermined frequency so that the electrical signal is restored from an optical signal after being transmitted via optical fiber. Many studies on radio-over fiber (RoF) link optical transmission technology for converting a radio frequency (RF) signal including a modulated signal (e.g., a binary phase shift keying (BPSK) signal, a quadrature phase shift keying (QPSK) signal, or a quadrature amplitude modulation (QAM) signal) into an optical signal and transmitting the optical signal via optical fiber in the transmission procedure have been performed.

In the RoF link optical transmission technology, a ratio of an RF signal recovered by a photodetector to an RF signal input to an optical modulator is defined as an RF gain. Increasing the RF gain is essential to the RoF link optical transmission technology. Accordingly, an optical modulator having high performance of electro-optic conversion and a photodetector having high performance of opto-electric conversion are required.

In the RoF link optical transmission technology, when an RF increases, the amount of transmittable data also increases, but a transmission distance from an antenna to a wireless terminal decreases. As a result, a lot of base stations (BS) are needed. Accordingly, a structure in which many functions are concentrated on a central office (CO) and a BS is simplified, thereby decreasing the price of the BS, is preferable.

FIG. 1A is a block diagram of a conventional RoF link optical transmission system. Referring to FIG. 1A, in the conventional RoF link optical transmission system, a light source is in a CO 10. The CO 10 is connected to a BS 30 via an optical fiber 20. The BS 30 transmits a wireless signal to a wireless terminal (WT) 40 through a transmitting antenna 36 and a receiving antenna 42 and receives a wireless signal from the WT 40 through a transmitting antenna 44 and a receiving antenna 38.

FIG. 1B is a detailed block diagram of the BS 30 illustrated in FIG. 1A. In a RoF link, the BS 30 is usually implemented by a duplexer in which the transmitting antenna 36, the receiving antenna 38, a photodetector 32, and an optical modulator 34 are integrated.

Time-division transmission is suitable for transmission using the BS 30 illustrated in FIG. 1B. For example, during a particular time slot, light including an RF signal is transmitted from the CO 10 to the BS 30 and the RF signal is restored by the photodetector 32 in the BS 30 and is wirelessly transmitted to the WT 40. During another particular time slot, light from the CO 10 passes through the photodetector 32 as it is, is then modulated by the optical modulator 34, and is then transmitted to the CO 10. Here, a wireless signal transmitted from the WT 40 is used for the optical modulation. In the RoF link optical transmission technology, essential devices such as the photodetector 32 and the optical modulator 34 used in the BS 30 should be designed to be suitable for analog transmission and to be easily manufactured.

Generally, in an optical modulator, an RF gain is proportional to the square of the intensity of output light and to the square of a transfer function slope. However, when the transfer function slope of the optical modulator increases, light insertion loss also increases, and therefore, the intensity of output light decreases. Usually, the light insertion loss of a multi-quantum well electro-absorption (EA) modulator is about 10 dB and is increased when a transfer function slope is increased. Most of the insertion loss of 10 dB occurs because an optical mode in the optical modulator disagrees with an optical mode in an optical fiber. A method of integrating a spot size converter into an optical modulator and a method of integrating an optical amplifier are used to reduce light insertion loss.

FIG. 2 is a perspective view of a semiconductor laser diode into which a conventional spot size converter (SSC) is integrated. Referring to FIG. 2, the SSC is connected to a laser using a butt-joint coupling method. The thickness of an optical waveguide is uniform in the laser and gradually decreases when the optical waveguide passes a butt-joint coupling portion. The structure illustrated in FIG. 2 is obtained when a selective area growth (SAG) method, a highly functional epitaxial growth method, is used. In the structure, the thickness of the waveguide of the SSC gradually decreases in a direction in which light proceeds and eventually becomes 0.2 μm or less at the end of the waveguide.

In detail, a laser area includes an n-type electrode layer 11, an n-type indium phosphide (InP) clad layer 12, an n-type current blocking layer 13, a p-type current blocking layer 14, a p-type clad layer 15, and a p-type electrode layer 16. An SSC area includes a passive optical waveguide 17, which is connected to a laser active layer 19 included within the laser area via a butt-joint interface 18 and tapers away.

To manufacture the above-described SSC, the SAG method is used. However, when the SAG method is used, the composition of a substance is changed, causing stress to occur in a substance layer. As a result, semiconductor crystals may be deteriorated. To manufacture the SSC using the SAG method without the deterioration of semiconductor crystals, it is necessary to very strictly keep the growth conditions for semiconductor crystals. However, since conventional methods of manufacturing the SSC provides a very small tolerance for the growth conditions, there are many difficulties in growing high-quality semiconductor crystals.

FIG. 3 is a perspective view of a structure in which a conventional SSC, an optical amplifier, and an EA modulator are monolithically integrated. Referring to FIG. 3, a Fe-doped InP layer, i.e., a current blocking layer 22, an indium gallium arsenide phosphide (InGaAsP) passive optical waveguide 23, and an n-type InP spacer 24 are grown on an n-type InP substrate 21 using an SAG method. Next, etching is performed so that the passive optical waveguide 23 has a width of about 1 μm. Thereafter, the current blocking layer 22 is regrown and planarized. Next, an active layer 25 for the optical amplifier and the EA modulator is grown using the SAG method. Thereafter, the active layer 25 in the optical amplifier is etched so that the width thereof is reduced in a side direction. Next, a p-type InP clad layer 26, a p-type InP cap layer, and an InGaAs contact layer are sequentially grown.

The structure illustrated in FIG. 3 has a dual-optical waveguide including a lower optical waveguide 23 and an upper optical waveguide 25. The lower optical waveguide 23 functions to increase an optical coupling with an optical fiber and the upper optical waveguide 25 functions to allow an optical mode to easily move from the optical amplifier to the lower optical waveguide 23. In detail, the lower optical waveguide 23 is grown using the SAG method such that the thickness thereof gradually decreases in a direction in which the optical mode propagates. Accordingly, the optical mode gradually increases and the efficiency of optical coupling with an optical fiber also increases. The upper optical waveguide 25 is also grown using the SAG method such that a width decreases in the direction in which the optical mode propagates, thereby allowing the optical mode to easily move to the lower optical waveguide 23.

The optical mode is strongly restrained in the optical modulator and the optical amplifier, thereby providing huge optical modulation or amplification efficiency (while the efficiency of optical coupling between an optical fiber and the strongly-restrained optical mode is very low). In the SSC, the optical mode is weakly restrained, that is, the size of the optical mode increases, and therefore, the efficiency of optical coupling with an optical fiber increases. As a result, all of the optical modulation efficiency, the optical amplification efficiency, and the optical coupling efficiency are maximized. However, since the structure illustrated in FIG. 3 is manufactured using the SAG method, manufacturing processes are complicated and it is difficult to manufacture high-quality devices.

When an output optical current increases, a photodetector provides a more advantageous RF gain. In other words, the photodetector is more advantageous when it has a large responsivity and receives a lot of light. To increase the responsivity of the photodetector, it is important to decrease light loss occurring during optical coupling with an optical fiber.

SUMMARY OF THE INVENTION

The present invention provides an electroabsorption duplexer in which an optical amplifier, a photodetector, and an optical modulator are monolithically integrated to provide high electro-optic/opto-electric conversion efficiency, i.e., high radio frequency (RF) gain without optical coupling loss with an optical fiber.

According to an aspect of the present invention, there is provided an electroabsorption duplexer including a substrate, a separation area, an optical detection/modulation unit, and an optical amplification unit. The separation area includes a first epitaxial layer formed of at least one material layer on the substrate. The first epitaxial layer functions as a first optical waveguide. The optical detection/modulation unit includes a second epitaxial layer formed of at least one material layer on the first epitaxial layer to detect and modulate an optical signal. The second epitaxial layer functions as a second optical waveguide. The optical amplification unit includes the second optical waveguide and a third epitaxial layer formed of at least one material layer on the second epitaxial layer to amplify an optical signal. The third epitaxial layer functions as a third optical waveguide. The optical amplification unit is electrically separated from the optical detection/modulation unit by the separation area and is disposed on at least one side of the optical detection/modulation unit.

The optical amplification unit may be disposed at each of both sides of the optical detection/modulation unit, and cross-sections of the optical waveguides may form a W shape as whole in a direction in which the optical signal propagates. In addition, each of the first, second and third optical waveguides may include a spot size converter as at least one end to allow an optical mode to efficiently move among the first, second and third optical waveguides.

The optical amplification unit may further include at least one optical waveguide made using at least one epitaxial layer formed of at least one material layer between the second epitaxial layer and the third epitaxial layer.

The electroabsorption duplexer is based on a triple-waveguide structure in which optical amplification is performed in the optical amplification unit and photodetection and optical modulation are performed in the optical detection/modulation unit. Meanwhile, the separation area electrically separates the optical amplification unit and the optical detection/modulation unit.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
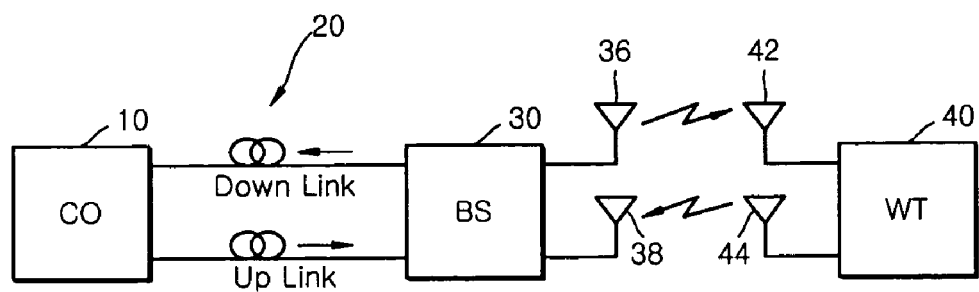
FIG. 1A is a block diagram of a conventional radio-over fiber (RoF) link optical transmission system.
Figure 1B:
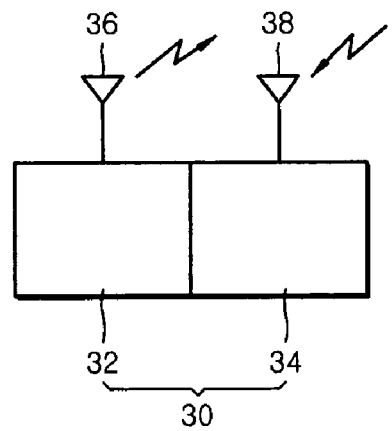
FIG. 1B is a detailed block diagram of a base station illustrated in FIG. 1A.
Figure 2:
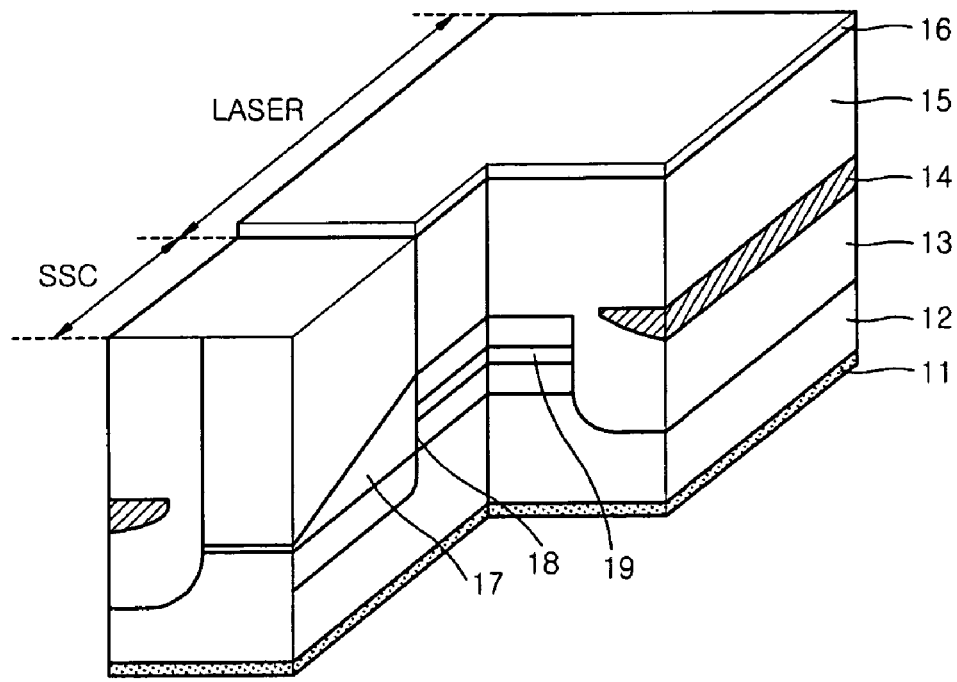
FIG. 2 is a perspective view of a semiconductor laser diode into which a conventional spot size converter (SSC) is integrated.
Figure 3:
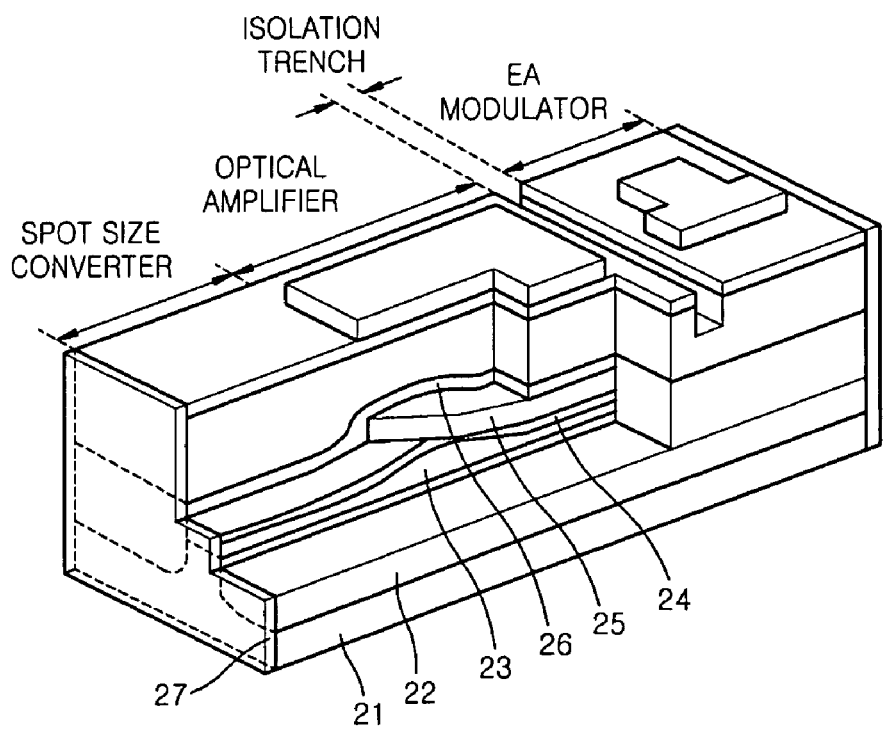
FIG. 3 is a perspective view of a structure in which a conventional SSC, an optical amplifier, and an electroabsorption (EA) modulator are monolithically integrated.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. It will be understood that when a layer is referred to as being "on" another layer or substrate, it can be directly on the other layer or substrate, or intervening layers may also be present. In the drawings, the thicknesses of layers and regions are exaggerated for clarity and like reference numerals denote like elements.

The present invention is used in a structure including a central office (CO) having a light source therein and a base station (BS). The present invention provides an electroabsorption (EA) duplexer in which an optical amplifier, a photodetector, and an optical modulator are monolithically integrated in the BS so that opto-electric conversion and electro-optic conversion are performed using a single semiconductor chip with high conversion efficiency and without optical coupling loss.

Figure 4A:
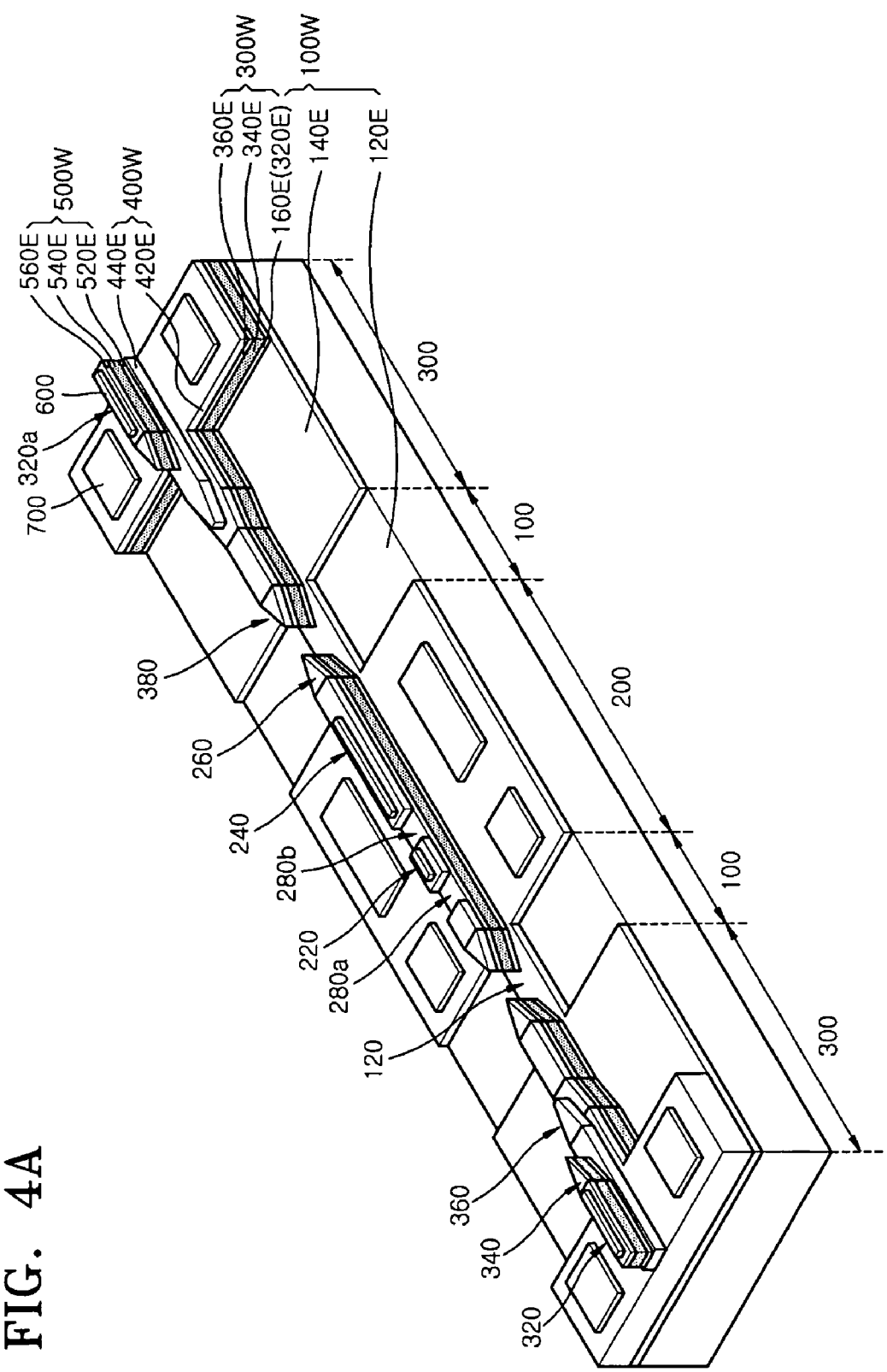
FIG. 4A is a perspective view of EA duplexer according to an embodiment of the present invention.

FIG. 4A is a perspective view of EA duplexer according to an embodiment of the present invention. Referring to FIG. 4A, the EA duplexer includes separation areas 100, an optical detection/modulation unit 200, and optical amplification units 300. The optical amplification units 300 are positioned at both sides, respectively, of the optical detection/modulation unit 200 and are electrically separated from the optical detection/modulation unit 200 by the separation areas 100, respectively.

Each of the optical amplification units 300 includes an optical amplifier 320 or 320a, a third spot size converter 340, a second first spot size converter 360, and a second third spot size converter 380. Each element is made using a plurality of epitaxial layers formed on a substrate 120E. In addition, an upper electrode 600 and lower electrodes 700 are formed on each of the optical amplification units 300 for optical amplification. Here, the optical amplifiers 320 and 320a amplify an input optical signal and the spot size converters 340, 360, and 380 efficiently move an optical mode between optical waveguides.

The optical detection/modulation unit 200 includes a photodetector 220 detecting light, an optical modulator 240 modulating light, and a second second spot size converter 260. In addition, an isolation trench 280b may be formed to electrically separate the photodetector 220 from the optical modulator 240. The second second spot size converter 260 serves to efficiently move an optical mode between a first optical waveguide and a second optical waveguide. An isolation trench 280a may be formed between the second second spot size converter 260 and the photodetector 220.

The separation areas 100 electrically separate the optical detection/modulation unit 200 from the optical amplification units 300, as described above, and transmit only an optical signal through a core 120 of the first optical waveguide.

Hereinafter, epitaxial layers formed on the substrate 120E will be described. The substrate 120E made using semi-insulating (SI) indium phosphide (InP), a core layer 140E made using 1.24 Q indium gallium arsenide phosphide (InGaAsP), and an upper clad layer 160E made using InP form a first optical waveguide 100W. Here, Q is the initial of "quaternary" and indicates that four elements are included. Numeral in front of "Q" expresses an energy band gap in terms of a wavelength. The substrate 120E functions as a lower clad layer of the first optical waveguide 100W. The first optical waveguide 100W transmits an optical signal in the separation areas 100.

The upper clad layer 160E of the first optical waveguide 100W also functions as a lower clad layer 320E of a second optical waveguide 300W. The lower clad layer 320E, a core layer 340E disposed on the lower clad layer 320E in a multi-quantum well structure of InGaAsP/InGaAsP, and an upper clad layer 360E made using p-type InP form the second optical waveguide 300W. The second optical waveguide 300W functions as a main optical waveguide of the optical detection/modulation unit 200. The core layer 340E functions as an absorption layer of the photodetector 220 and the optical modulator 240.

A second first optical waveguide 400W is formed on the second optical waveguide 300W. In the drawing, a lower clad layer and a core layer of the second first optical waveguide 400W are combined in a lower second first optical waveguide layer 420E. An upper clad layer 440E of the second first optical waveguide 400W is made using 1.24 Q InGaAsP. The lower second first optical waveguide layer 420E forms the second second spot size converter 260 and the second third spot size converter 380 together with the epitaxial layers 320E, 340E, and 360E. Meanwhile, the lower second first optical waveguide layer 420E functions as a p-type metal contact layer of the photodetector 220 and the optical modulator 240. The upper clad layer 440E of the second first optical waveguide 400W forms the second first spot size converter 360. The isolation trenches 280a and 280b are formed by etching the upper clad layer 440E and the lower second first optical waveguide layer 420E.

A third optical waveguide 500W is formed on the second first optical waveguide 400. A lower clad layer 520E made using p-type InP, a core layer 540E made using 1.6 Q InGaAsP, and an upper clad layer 560E made using n$^+$-type InP form the third optical waveguide 500W. The third optical waveguide 500W forms the optical amplifiers 320 and 320a and the third spot size converter 340.

Hereinafter, the structure and the size of each optical waveguide will be described. The second optical waveguide 300W in the optical detection/modulation unit 200 and the optical amplification units 300 has a shape of a deep or shallow ridge having a width of 1-3 μm and a thickness of 1.5-2.5 μm. The third optical waveguide 500W in the optical amplification units 300 also has a shape of a deep or shallow ridge having a width of 1-3 μm and a thickness of 1.5-2.5 μm. The core layer 120 of the first optical waveguide 100W in the separation areas 100 has a width of 2-5 μm and a thickness of 0.2-1 μm.

Each optical waveguide includes a spot size converter formed in a wedge shape as at least one end. The third spot size converter 340 has the same width as the third optical waveguide 500W at its start and a reduced width of 0.7 μm or less at its end and is 200 μm or less in length. The second first spot size converter 360 has a width equal to or greater than the width of the third optical waveguide 500W at its start and a reduced width of 1 μm or less at its end and is 100 μm or less in length. The second second spot size converter 260 and the second third spot size converter 380 have the same width as the second optical waveguide 300W at their starts and a reduced width of 0.7 μm or less at their ends and are 200 μm or less in length.

The length of the photodetector 220 is 100 μm or less and the length of the optical modulator 240 is 600 μm or less. The entire thickness of all epitaxial layers formed on the substrate 120E is about 3-5 μm.

In the current embodiment of the present invention, the second first optical waveguide 400W is formed between the second optical waveguide 300W and the third optical waveguide 500W, but it may be eliminated. When necessary, two or more optical waveguides may be further formed using two or more epitaxial layers each made of at least one material layer.

Figure 4B:
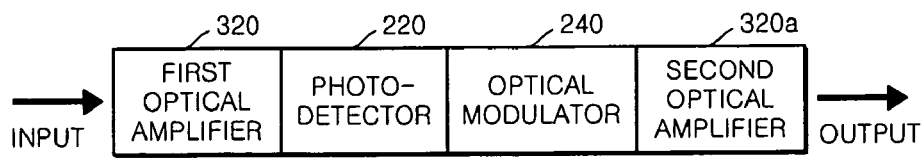
FIG. 4B is a block diagram illustrating connection of elements integrated in the EA duplexer illustrated in FIG. 4A.

FIG. 4B is a block diagram illustrating connection of elements integrated in the EA duplexer illustrated in FIG. 4A. Referring to FIG. 4B, the first optical amplifier 320, the photodetector 220, the optical modulator 240, and the second optical amplifier 320a are sequentially integrated in the EA duplexer in a light propagation direction. Referring to FIG. 4A, the third spot size converter 340, the second first spot size converter 360, the second third spot size converter 380, and the second second spot size converter 260 are sequentially disposed between the first optical amplifier 320 and the photodetector 220 and are disposed in reverse order between the optical modulator 240 and the second optical amplifier 320a. Meanwhile, the core layer 120 of the first optical waveguide 100W is formed between the second second spot size converter 260 and the second third spot size converter 380 such that the optical detection/modulation unit 200 is electrically separated from each of the optical amplification units 300.

The first optical amplifier 320 compensates for optical coupling loss with an optical fiber and increases the intensity of light input to the photodetector 220, thereby increasing the responsivity of the photodetector 220. When the optical modulator 240 is designed to have a steep transfer function to increase an RF gain, light having passed through the optical modulator 240 has very small intensity. However, the light is eventually amplified by the second optical amplifier 320a and a satisfactory RF gain is obtained.

In detail, the structure of elements according to the present invention is suitable for time division transmission. For example, for a predetermined period of time, an RF-modulated optical signal transmitted from the CO via an optical fiber is amplified by the first optical amplifier 320 and is then converted to an electrical signal by the photodetector 220. Here, a bias voltage is applied to the photodetector 220 via the metal electrodes 600 and 700. For another predetermined period of time, non-modulated light is transmitted from the CO to the BS, is then transmitted through the photodetector 220 while a bias voltage is not applied to the photodetector 220, and is then input to the optical modulator 240. An RF signal received from a wireless terminal (WT) through an antenna of the BS modulates non-modulated light input to the optical modulator 240. An RF-modulated optical signal is amplified by the second optical amplifier 320a and is transmitted to the CO via the optical fiber. Here, a bias voltage is applied to the optical modulator 240. The photodetector 220 and the optical modulator 240 share the core layer, i.e., active core 340E of the second optical waveguide 300W. The active core 340E is implemented by a multi-quantum well and is designed such that absorption does not occur when no voltage is applied and absorption is induced with an absorption edge of 1550 nm when a voltage is applied. Here, it is assumed that light provided from the CO has a wavelength of 1550 nm.

Figure 4C:
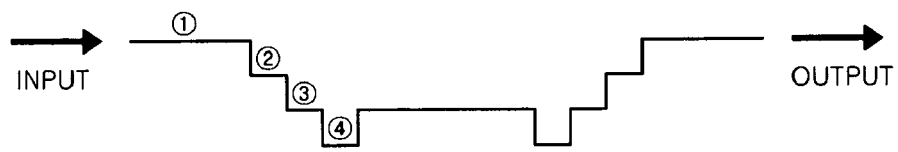
FIG. 4C is a conceptual diagram illustrating the positional relationships among optical waveguides included in elements of the EA duplexer illustrated in FIG. 4A.

FIG. 4C is a conceptual diagram illustrating the positional relationships among optical waveguides included in elements of the EA duplexer illustrated in FIG. 4A when the EA duplexer is vertically cut in a light propagation direction. Referring to FIG. 4C, a portion ① corresponding to the third optical waveguide 500W in each of the optical amplification units 300 forms an uppermost layer, and a portion ② corresponding to the second first optical waveguide 400W, a portion ③ corresponding to the second optical waveguide 300W, and a portion ④ corresponding to the first optical waveguide 100W are sequentially lowered step by step.

Figure 5:
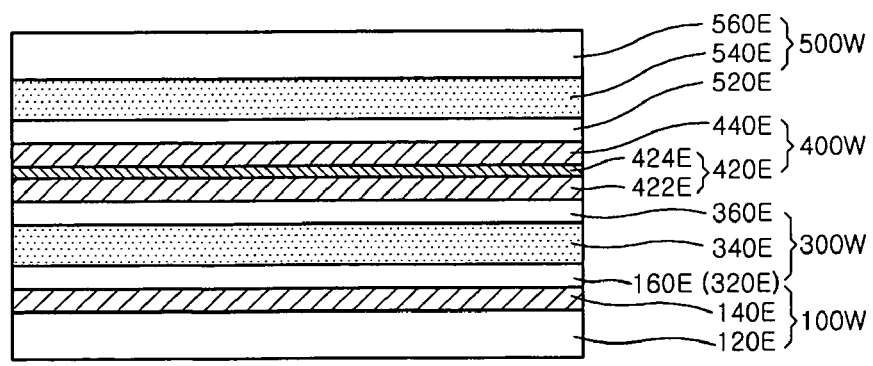
FIG. 5 is a sectional view of an EA duplexer including all epitaxial layers used in an embodiment of the present invention.

FIG. 5 is a sectional view of an EA duplexer including all epitaxial layers used in an embodiment of the present invention. Referring to FIG. 5, the SI InP substrate 120E, the 1.24 Q $n^+$-type InGaAsP core layer 140E, and the intrinsic InP upper clad layer 160E form the first optical waveguide 100W. The intrinsic InP lower clad layer 320E, the core layer 340E implemented by a multi-quantum well for the photodetector 220 and the optical modulator 240, and the p-type InP upper clad layer 360E form the second optical waveguide 300W. The lower second first optical waveguide layer 420E includes a p-type 1.24 Q InGaAsP lower clad layer 422E and a 1.3 Q InGaAsP p-type contact layer 424E functioning as a core layer. The lower second first optical waveguide layer 420E and the 1.24 Q InGaAsP upper clad layer 440E form the second first optical waveguide 400W. The 1.3 Q InGaAsP p-type contact layer 424E forms a common p-type metal contact layer for the photodetector 220 and the optical modulator 240 and has a thickness of about 0.1-0.3 µm. The p-type InP lower clad layer 520E, the 1.6 Q InGaAsP core layer 540E, and the $n^+$-type InP upper clad layer 560E form the third optical waveguide 500W.

Meanwhile, the core layers 540E and 340E for the optical amplifiers 320 and 320a and the optical detection/modulation unit 200 may be formed in a multi-quantum well or in bulk or may be strained to prevent an optical signal from being polarized. The effective refraction index of an optical mode is highest in the third optical waveguide 500W and sequentially decreases in order of the second first optical waveguide 400W, the second optical waveguide 300W, and the first optical waveguide 100W. Accordingly, when all of the optical waveguides 500W, 400W, 300W, and 100W are present, an optical signal is transmitted via the third optical waveguide 500W. When an upper optical waveguide is not present, the optical signal is spontaneously transmitted via a subsequent lower optical waveguide. When the upper optical waveguide is present, the optical signal is transmitted via the upper optical waveguide again. As a result, the optical signal is transmitted in a shape of W in the current embodiment of the present invention.

Hereinafter, a method of manufacturing an EA duplexer according to an embodiment of the present invention will be described briefly.

As-grown epitaxial layers are sequentially formed on the substrate 120E. Considering positional relationships among elements in vertical and horizontal directions, photolithography, dry etching, and selective wet etching are performed, thereby forming the elements. Here, spot size converts on one optical waveguide are formed simultaneously. Finally, the upper and lower metal electrodes 600 and 700 are formed for the optical amplifiers 320 and 320a, the photodetector 220, and the optical modulator 240. As a result, an EA duplexer in which the optical amplifiers 320 and 320a, the photodetector 220, and the optical modulator 240 are monolithically integrated is manufactured. Accordingly, the EA duplexer is easily manufactured at low cost without using a conventional butt-joint coupling or selective area growth (SAG) method.

Epitaxial layers from the substrate 120E to the 1.3 Q InGaAsP p-type contact layer 424E forming a core layer of the second first optical waveguide 400W are provided for the photodetector 220 and the optical modulator 240. Epitaxial layer from the 1.3 Q InGaAsP p-type contact layer 424E to the $n^+$-type InP upper clad layer 560E of the third optical waveguide 500W are provided for the optical amplifiers 320 and 320a. The optical detection/modulation unit 200 and each of the optical amplification units 300 share one epitaxial layer, i.e., the p-type contact layer 424E dividing epitaxial layers into lower epitaxial layer and upper epitaxial layers. In other words, optical amplification occurs in the upper epitaxial layers while photodetection and optical modulation occur in the lower epitaxial layers. Accordingly, input light proceeds from up to down and from down to up. For efficient up/down movement of light, a spot size converter is needed. The spot size converter has a wedge shape, as described above.

In the embodiment of the present invention, the two third spot size converters 340 are present on the third optical waveguide 500W; the two second first spot size converters 360 are present on the second first optical waveguide 400W; and the two second second spot size converters 260 and the two second third spot size converters 380 are present on the second optical waveguide 300W. Accordingly, a total of 8 spot size converters are formed in the EA duplexer. However, one or more optical waveguides may be formed between the second optical waveguide 300W and the third optical waveguide 500W, and therefore, the number of spot size converters may be increased or decreased.

Figure 6A:
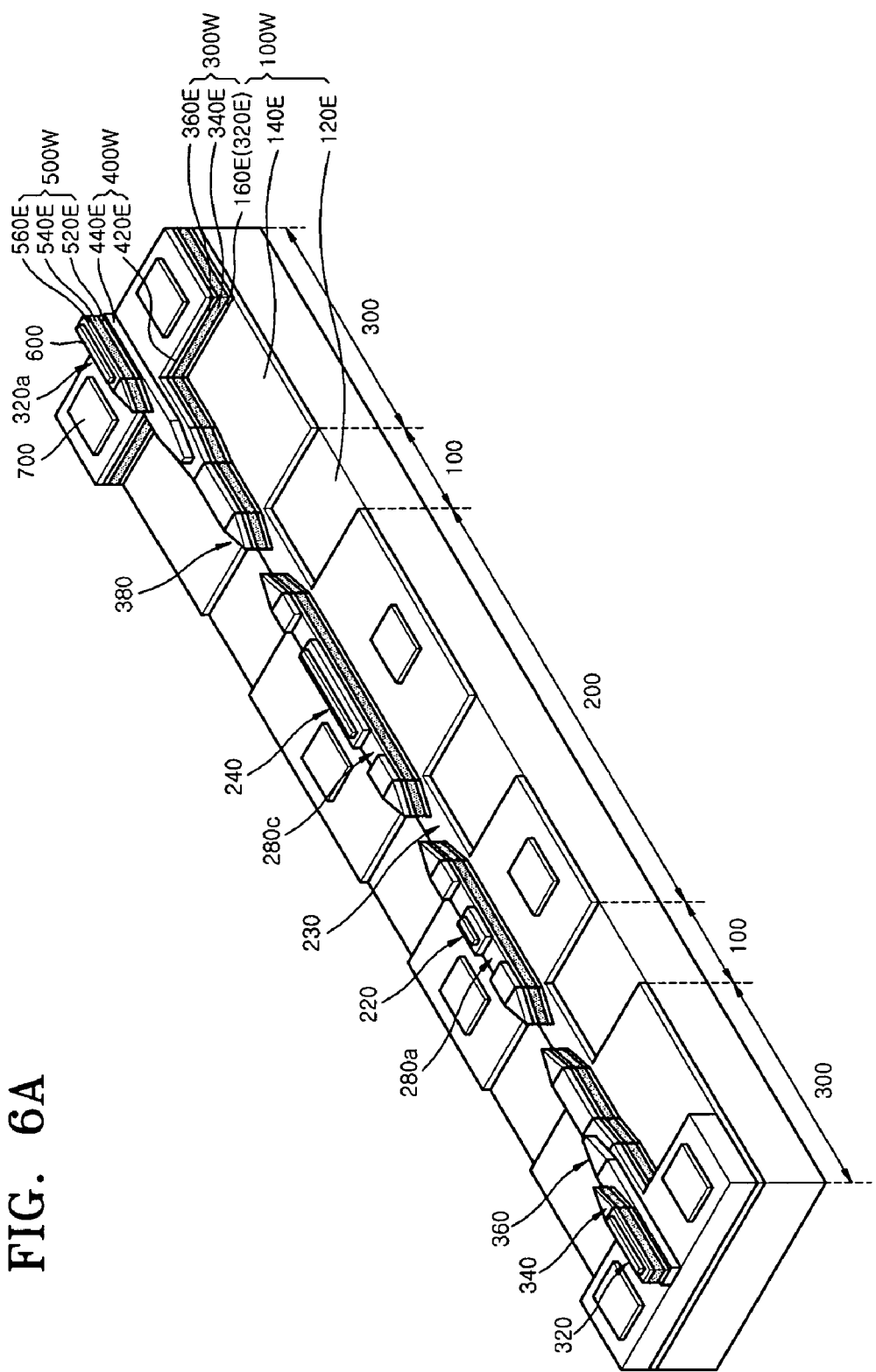
FIG. 6A is a perspective view of an EA duplexer according to another embodiment of the present invention.
Figure 6B:
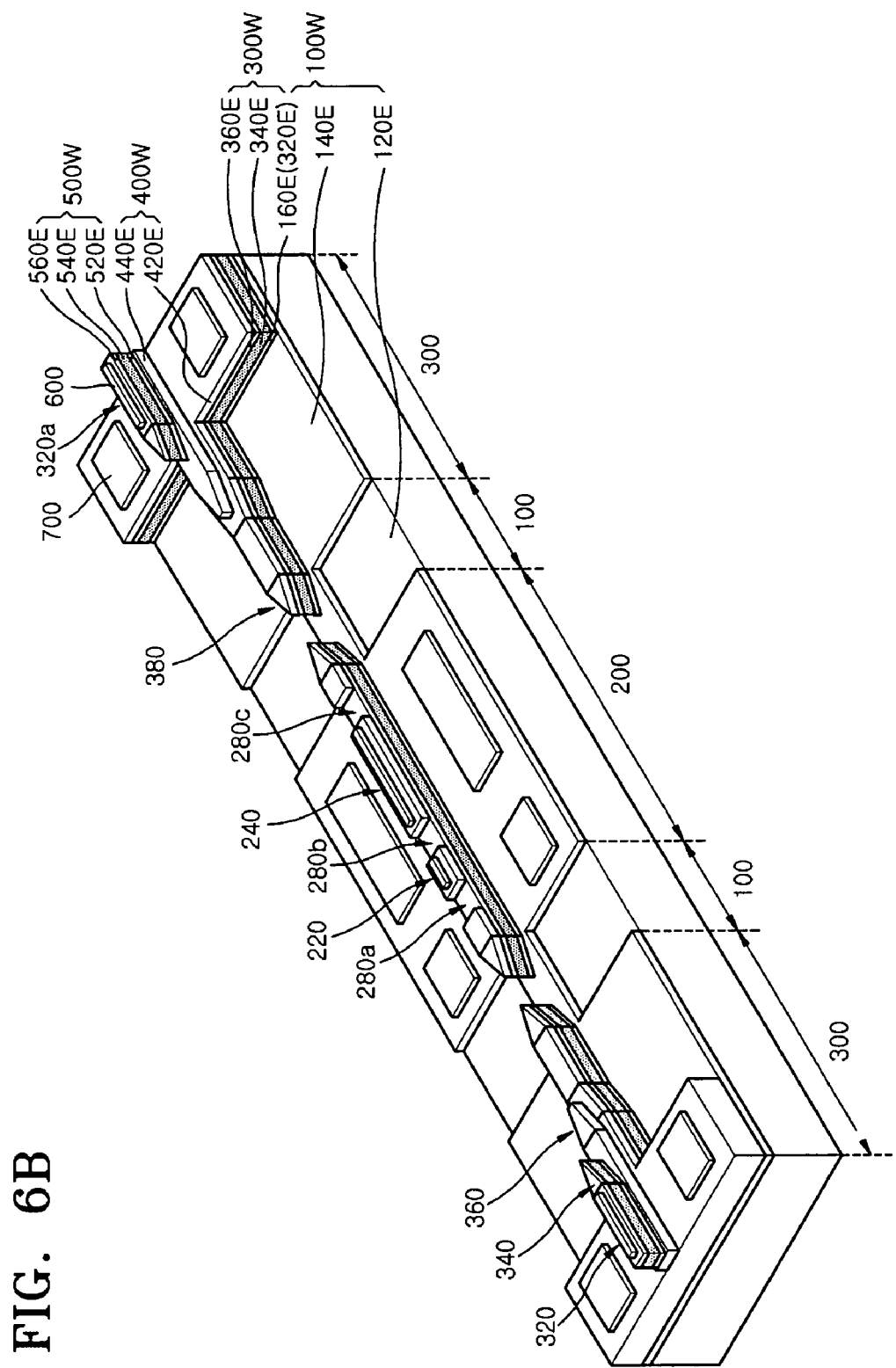
FIG. 6B is a perspective view of an EA duplexer according to still another embodiment of the present invention.

FIG. 6A is a perspective view of an EA duplexer according to another embodiment of the present invention. FIG. 6B is a perspective view of an EA duplexer according to still another embodiment of the present invention. The EA duplexers illustrated in FIGS. 6A and 6B are almost the same as that illustrated in FIG. 4A, with the exception that the shape and the number of isolation trenches are different.

Referring to FIG. 6A, each of the photodetector 220 and the optical modulator 240 has spot size converters at both ends, respectively. The photodetector 220 and the optical modulator 240 are electrically separated from each other by a core layer 230 of a first optical waveguide. In addition, the photodetector 220 is separated from the spot size converters by the insulation trenches 280a and the optical modulator 240 is separated from the spot size converters by insulation trenches 280c. Accordingly, the photodetector 220 and the optical modulator 240 more surely operate without being influenced by other elements, thereby having improved performance.

Referring to FIG. 6B, an isolation trench 280c is formed between the optical modulator 240 and a spot size converter 260, thereby eliminating electromagnetic influence between the optical modulator 240 and the spot size converter 260.

Figure 7:
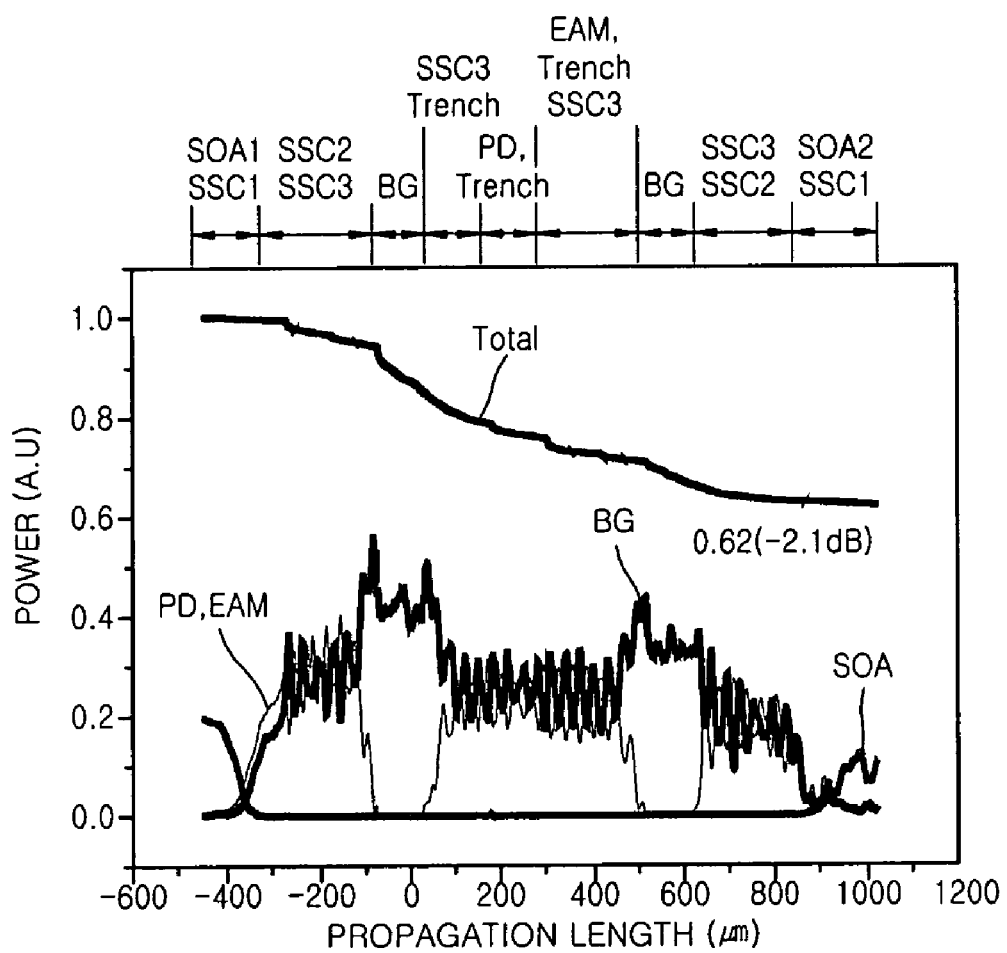
FIG. 7 is a graph illustrating optical power and overall optical loss appearing in individual optical waveguides extending in a light propagation direction in an EA duplexer embodied according to the present invention in a beam propagation method (BPM) simulation.

FIG. 7 is a graph illustrating optical power and overall optical loss appearing in individual optical waveguides extending in a light propagation direction in an EA duplexer embodied according to the present invention in a beam propagation method (BPM) simulation. An assumption was made that an optical amplifier, a photodetector, and an optical modulator are considered as simple passive optical waveguides. Only optical coupling loss between optical waveguides was considered.

According to the graph, a first semiconductor optical amplifier SOA1 corresponding to the first optical amplifier 320, a photodetector PD corresponding to the photodetector 220, an EA modulator EAM corresponding to the optical modulator 240, and a second semiconductor optical amplifier SOA2 corresponding to the second optical amplifier 320a are sequentially arranged. In addition, a spot size converter SSC1 corresponding to the third spot size converter 340, a spot size converter SSC3 corresponding to the second first spot size converter 360, a spot size converter SSC2 corresponding to both the second third spot size converter 380 and the second second spot size converter 260 are sequentially arranged from the first optical amplifier 320 to the photodetector 220 and are arranged in reverse order from the optical modulator 240 to the second optical amplifier 320a. Meanwhile, a base guide BG corresponding to the core layer 120 of the first optical waveguide 100W is disposed between the second second spot size converter SSC2 260 and the second third spot size converter SSC2 380.

Referring to FIG. 7, total optical power is reduced by about 2.1 dB, showing a good optical loss characteristic. Accordingly, it is proved that the EA duplexer according to an embodiment of the present invention has reduced optical coupling loss and high electro-optic/opto-electric conversion efficiency.

As described above, according to the present invention, an optical amplifier, a photodetector, and an optical modulator are monolithically integrated in an EA duplexer, thereby providing high electro-optic/opto-electric conversion efficiency without optical coupling loss. As a result, the prevent invention provides a high RF gain in radio-over fiber (RoF) link optical transmission technology. In addition, since monolithic integration is realized using general photolithography, dry etching, and selective wet etching without using a SAG method or butt-joint coupling, a BS can be manufactured at low cost.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electroabsorption duplexer comprising:
    a substrate;
    a separation area comprising a first epitaxial layer formed of at least one material layer on the substrate, the first epitaxial layer functioning as a first optical waveguide;
    an optical detection/modulation unit comprising a second epitaxial layer formed of at least one material layer on the first epitaxial layer to detect and modulate an optical signal, the second epitaxial layer functioning as a second optical waveguide; and
    an optical amplification unit disposed at each both sides of the optical detection/modulation unit comprising the second optical waveguide and a third epitaxial layer formed of at least one material layer on the second epitaxial layer to amplify an optical signal, the third epitaxial layer functioning as a third optical waveguide,
    wherein the optical amplification unit is electrically separated from the optical detection/modulation unit by the separation area and is disposed on at least one side of the optical detection/modulation unit
    wherein an effective refractive index of the optical waveguides increases in order of the first optical waveguide, the second optical waveguide, and the third optical waveguide, the cross-sections of the optical waveguides form a W shape as whole in a direction in which the optical mode propagates, and the optical mode moves in a direction from top to bottom and from bottom to top according to the W shape such that the W shape creates the electrical separation of the optical amplification unit and the optical detection/modulation unit.

2. The electroabsorption duplexer of claim 1, wherein the second and third optical waveguides have a deep or shallow ridge shape having a width of 2-3 μm and a thickness of 1.5-2.5 μm.

3. The electroabsorption duplexer of claim 1, wherein the first optical waveguide has a width of 2-5 μm and a thickness of 0.2-1 μm.

4. The electroabsorption duplexer of claim 1, each of the first, second and third optical waveguides comprises a spot size converter at least one end to allow an optical mode to efficiently move among the first, second and third optical waveguides.

5. The electroabsorption duplexer of claim 4, wherein the third optical waveguide comprises a third spot size converter toward the optical detection/modulation unit, the second optical waveguide in the optical amplification unit comprises a second third spot size converter on the first optical waveguide toward the optical detection/modulation unit, and the second optical waveguide in the optical detection/modulation unit comprises a second second spot size converter on the first optical waveguide toward the optical amplification unit.

6. The electroabsorption duplexer of claim 4, wherein the optical amplification unit further comprises a second first optical waveguide formed of a second first epitaxial layer between the second epitaxial layer and the third epitaxial layer, and the second first optical waveguide is longer than the third optical waveguide and comprises a second first spot size converter toward the optical detection/modulation unit.

7. The electroabsorption duplexer of claim 6, wherein the optical mode of an optical signal input to the third optical waveguide is moved to the second first optical waveguide via the third spot size converter, then to the second optical waveguide in the optical amplification unit via the second first spot size converter, then to the first optical waveguide via the second third spot size converter so that the optical mode is moved three times from the third optical waveguide to the first optical waveguide.

8. The electroabsorption duplexer of claim 6, wherein each of the optical waveguides has a ridge shape, the spot size converter comprised in each optical waveguide has a wedge shape, the third spot size converter has the same width as the third optical waveguide at its start and a reduced width of 0.7 μm or less at its end and is 200 μm or less in length, the second first spot size converter has a width equal to or greater than the width of the third optical waveguide at its start and a reduced width of 1 μm or less at its end and is 100 μm or less in length, and the second second spot size converter and the second third spot size converter have the same width as the second optical waveguide at their starts and a reduced width of 0.7 μm or less at their ends and are 200 μm or less in length.

9. The electroabsorption duplexer of claim 1, wherein the substrate is made using semi-insulator indium phosphide (lnP), and the first epitaxial layer is made using 1.24 Q indium gallium arsenide phosphide (lnGaAsP).

10. The electroabsorption duplexer of claim 9, wherein the first epitaxial layer functions as an n-type metal contact layer at a bottom of the second optical waveguide in the optical detection/modulation unit.

11. The electroabsorption duplexer of claim 1, wherein the optical detection/modulation unit further comprises:
second second spot size converters at both ends, respectively, to efficiently move an optical mode;
a photodetector detecting an optical signal;
an optical modulator modulating an optical signal; and
an isolation trench electrically separating the photodetector and the optical modulator.

12. The electroabsorption duplexer of claim 11, wherein the optical detection/modulation unit further comprises an isolation trench at least one among a portion between one second second spot size converter and the photodetector and a portion between the optical modulator and the other second second spot size converter for electrical separation.

13. The electroabsorption duplexer of claim 11, wherein the photodetector has a length of 100 μm or less, and the optical modulator has a length of 600 μm or less.

14. The electroabsorption duplexer of claim 11, wherein optical detection/modulation unit further comprises a p-type contact layermade using 1.3 Q indium gallium arsenide phosphide (lnGaAsP) on an upper clad layer comprised In the second optical waveguide, and the isolation trench Is formed by etching the p-type contact layer or the second epitaxial layer.

15. The electroabsorption duplexer of claim 1, wherein a total thickness of all of the epitaxial layers is 3-5 μm.

16. The electroabsorption duplexer of claim 1, wherein the second epitaxial layer comprises a p-type metal contact layer at its top; the optical amplification unit further comprises an optical amplifier formed on the p-type metal contact layer to amplify an optical signal; the optical detection/modulation unit further comprises a photodetector and an optical modulator below the p-type metal contact layer to detect and modulate an optical signal; and the optical amplifier, the photodetector, and the optical modurator share the p-type metal contact layer formed of one epitaxial layer.

17. The electroabsorption duplexer of claim 16, wherein the p-type metal contact layer is made using 1.3 Q indium gallium arsenide phosphide (lnGaAsP) and has a thickness of 0.1-0.3 μm.

18. The electroabsorption duplexer of claim 1, wherein the third optical waveguide comprises an active core formed in a multi-quantum well or bulk structure.

19. The electroabsorption duplexer of claim 1, wherein the third optical waveguide comprises an active core made using 1.6 Q indium gallium arsenide phosphide (lnGaAsP).

20. The electroabsorption duplexer of claim 1, wherein each of the third and second optical waveguides comprises an active core which is strained to prevent an optical signal from being polarized.

21. The electroabsorption duplexer of claim 1, wherein the optical amplification unit further comprises at least one optical waveguide made using at least one epitaxial layer formed of at least one material layer between the second epitaxial layer and the third epitaxial layer.

* * * * *